United States Patent [19]
Feldhusen et al.

[11] Patent Number: 5,559,371
[45] Date of Patent: Sep. 24, 1996

[54] ARRANGEMENT FOR PREMOUNTING DISK-SHAPED CELL SEMICONDUCTORS CONTACTABLE BY PRESSURE

[75] Inventors: Joerg Feldhusen; Bernd Von Der Heydt, both of Berlin, Germany

[73] Assignee: AEG Schienenfahrzeuge GmbH, Berlin, Germany

[21] Appl. No.: 367,295

[22] PCT Filed: Jun. 19, 1993

[86] PCT No.: PCT/EP93/01578

§ 371 Date: Jan. 12, 1995

§ 102(e) Date: Jan. 12, 1995

[87] PCT Pub. No.: WO94/03927

PCT Pub. Date: Feb. 17, 1994

[30] Foreign Application Priority Data

Aug. 10, 1992 [DE] Germany .................. 42 26 727

[51] Int. Cl.⁶ .......................... H01L 23/02; H01L 23/48; H01L 23/34; H01L 23/04
[52] U.S. Cl. .......................... 257/686; 257/688; 257/689; 257/730; 257/727; 257/726
[58] Field of Search .................. 257/686, 703, 257/714, 715, 689, 719, 730, 727, 746, 747, 688, 726, 718

[56] References Cited

U.S. PATENT DOCUMENTS 3,654,528  4/1972  Barkan .................. 257/688

FOREIGN PATENT DOCUMENTS 58-139453  8/1983  Japan .................. 257/727
58-200561  11/1983  Japan .................. 257/726

Primary Examiner—Sara W. Crane
Assistant Examiner—Jhihan Clark
Attorney, Agent, or Firm—Spencer & Frank

[57] ABSTRACT

The invention relates to an arrangement for a preassembled structure of disc cell semiconductors that can be pressure-contacted, in which a loose, stacked module comprising disc cell semiconductors, associated terminal tags and end-side cooling cells and insulating cells is held together until final assembly by means of loose fixation via insulating pipes that serve to insulate the studs to be brought in later for pressure-fixation of the module, for which purpose the insulating pipes, each being provided at one end with a flange, engage a common holding plate from behind, and are guided at the other end through a common insulator, via which axial securing of the module is effected through frictional-lockup connection to the insulating pipes by means of a tightening strap. To achieve improved fixation and axial securing of the components against falling apart, it is proposed in accordance with the invention that the holding plate (3) and the insulator (2) are guided axially movably via the insulating pipes (13), wherein the holding plate (3) is supported against the flanges (13a) of the insulating pipes (13) via spring elements (18), and a frictional-lockup element to the insulating pipes (13) is associated with the insulator (2) and permits limited movement in the axial direction.

13 Claims, 2 Drawing Sheets

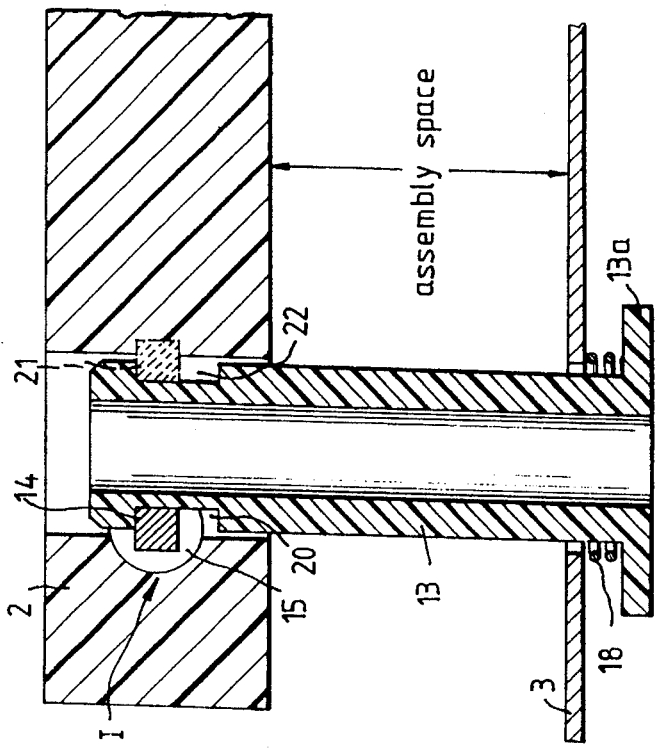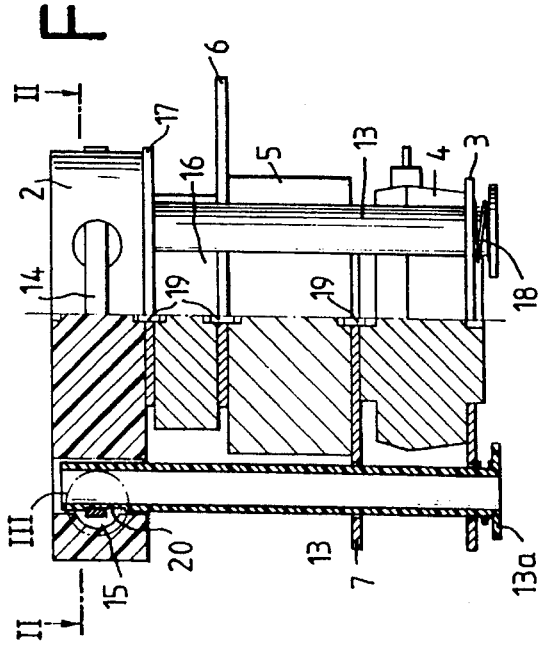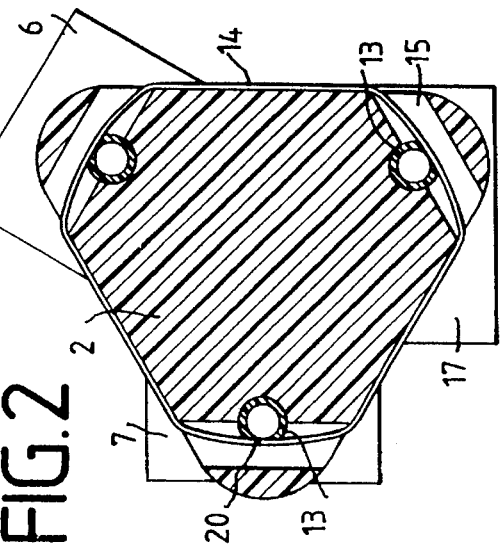

ARRANGEMENT FOR PREMOUNTING DISK-SHAPED CELL SEMICONDUCTORS CONTACTABLE BY PRESSURE

BACKGROUND OF THE INVENTION

The invention relates to an arrangement for a preassembled structure of disc cell semiconductors that can be pressure-contacted, and including a plurality of insulating pipes each being provided at one end with a flange. The insulating pipes loosely fix the stacked module together. The insulating pipes receive studs for pressure fixation of the stacked module together. A common holding plate at a first end of said stacked module receives the insulating pipes. The holding plate has a lower side in engagement with the flanges of the insulating pipes. A common insulator is provided at a second end of the stacked module. The insulating pipes are guided through the common insulator. A tightening strap causes a frictional lockup connection between the stacked module and the insulating pipes to axially secure the stacked module. Thus, the arrangement is for loosely securing a stacked module of disc cell semiconductors.

Preassembled modules that need only be positioned, screwed in place and connected at the point of installation without any particular assembly problems can be formed from such arrangements.

A voltage cell structure that has been used for years in rail operations comprises column-like disc cell semiconductors stacked loosely between end plates, associated terminal tags, and end-side cooling cells and insulating cells that are first secured in a stable manner by two or three studs and receive the necessary pressure contacting via a common compression spring plate during final assembly. The specific looseness of the preassembled structure requires axial securing to prevent the individual parts from falling apart, which is achieved by means of a tightening strap that extends through lateral holes of an end-side insulator. The studs, and more precisely their covering insulating pipes, are thereby enclosed. The module is prevented from falling apart by frictional lockup.

It has been seen that this loose fixation is inadequate for many built-in or disassembled items. Particularly in heavy, preassembled voltage cell structures, the frictional lockup of the axial securing can be overcome by the components' own weight. The result is that the module either falls apart into its individual components, or becomes so loose that the conventional centering pins between the components slip out of their counter-centering bores, which cannot be easily seen from the outside. During final assembly, improperly seated centering pins cause the destruction of the contiguous disc cell semiconductor. The effect cannot even be eliminated through strong prestress of the tightening strap.

SUMMARY OF THE INVENTION

The object of the invention, finally, is to prevent the structure from falling apart with the consequence of requiring readjustment work, and possibly even destruction of the semiconductors if care is not used during final assembly. The special object lies in an improved fixation.

This is accomplished by providing a holding plate and a common insulator that are axially and movably guided via the insulating pipes. The holding plate is supported on the flanges of the insulating pipes via a plurality of spring elements. A frictional lockup element is associated with the common insulator to permit limited movement in the axial direction.

BRIEF DESCRIPTION OF THE DRAWINGS

The invention is described in detail below with reference to schematic embodiments.

Shown are in:

FIG. 1 view of a voltage cell structure of the invention in halved section;

FIG. 2 top view of FIG. 1 along section line II—II;

FIG. 3 a schematic, enlarged view of detail III from FIG. 1 (sectional view);

DETAILED DESCRIPTION OF THE INVENTION

Figure 4:
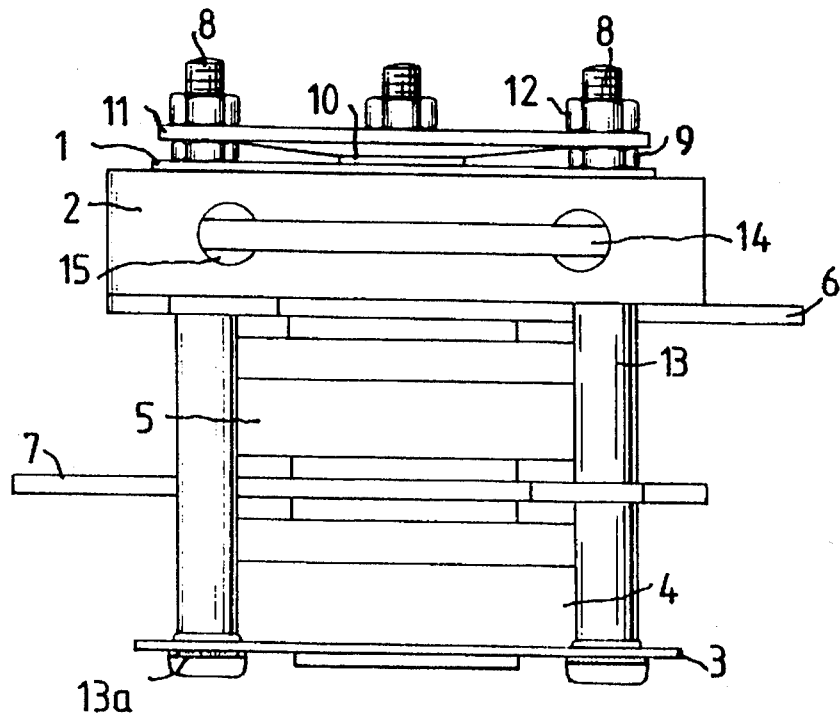
FIG. 4 side view of a known clamping device for one-sided cooling.
Figure 5:
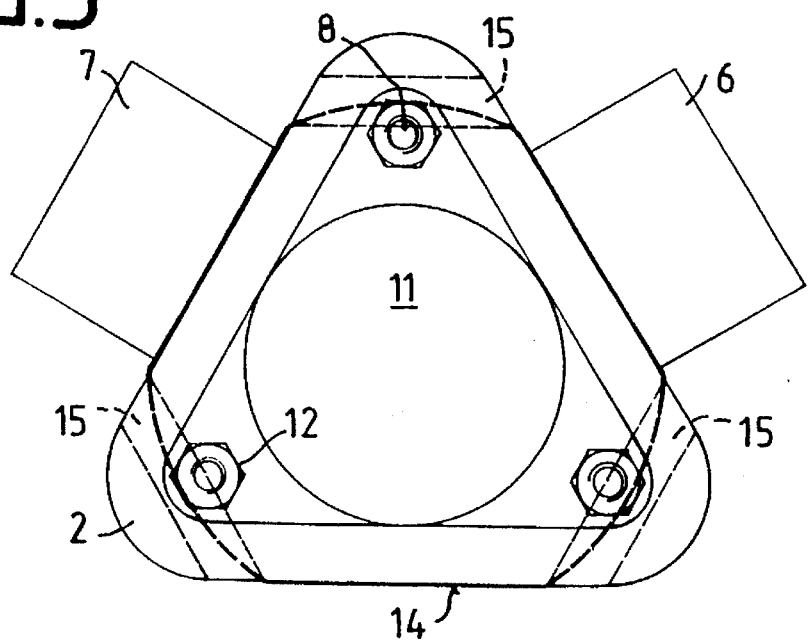
FIG. 5 top view of the clamping device of FIG. 4.

The known voltage cell structure used as the point of departure is illustrated in FIGS. 4 and 5. A stacked columnar structure is visible that comprises a centering plate 1 having on the one side (here at the very top) a contiguous, triangular insulator 2 for one-sided cooling, and on the other side (here at the very bottom) a holding plate 3 that has a contiguous insulating cell 4. A disc cell semiconductor 5, for example a GTO thyristor, having terminal tags 6 and 7 associated with the electrodes is clamped between these. By means of a plurality—in this instance three—threaded pins 8 that symmetrically penetrate the holding plate 3, the insulator 2 and the centering plate 1 at the circumference, the module is held together by means of nut 9. The required contact pressure is generated via an interposed pressure member 10 and a triangular compression spring 11 that is likewise penetrated by the threaded pins 8, as well as further nuts 12. Threaded pins 8 are guided in insulating pipes 13 that serve in electrical insulation and are provided for loosely fixing the module before final assembly. The insulating pipes preferably have flanges 13a glued to one side and are inserted through holding plate 3, i.e., the flanges engage holding plate 3 from behind. Without the clamping device, that is, without threaded pins 8, nuts 9 and 12, centering plate 1 and triangular compression spring 11, the module would fall apart. A tightening strap 14, which securely encircles the insulating pipe 13 in the inside regions and is guided through lateral holes 15 extending from corner to corner in the insulator prevents this by means of frictional lockup at the insulating pipe. This known embodiment has the drawbacks mentioned above that are intended to be eliminated.

FIGS. 1 through 3 show the new structure in accordance with the invention. The same reference numerals were again selected for identical components.

FIG. 1 shows two clamped disc cell semiconductors 5 and 16, and three pulled-out terminal tags 6, 7, 17. The elements are centered via centering pins 19 and counter-centering bores. Insulating pipes 13 no longer directly engage holding plate 3 from behind, here with their flanges 13a; instead, spring elements 18 are interposed. These spring elements can be disk springs, helical springs or spring elements having rubber-like elasticity, and are intended to apply the actual prestress force for securing the module. Insulating pipes 13 further respectively have an outer, peripheral transverse groove 20 at what is the upper edge here, in the region of insulator 2, in which groove—as illustrated in region III—tightening strap 14 can extend axially secured (also see FIG. 2). Transverse groove 20 can—as shown on an enlarged scale in FIG. 3—be configured as a one-sided, outwardly-oriented tangential groove or possibly as an annular groove. On the right half-side of the sectioned insulating pipe 13, FIG. 3 shows another modification in dashed lines in which a divided inside ring 21—guided correspondingly through lateral holes 15 of insulator 2—is additionally located in a further transverse groove of insulator 2, opposite transverse groove 20 for tightening strap 14. A circumferential annular groove could join the two transverse grooves. Holding plate 3 and insulator 2 are guided axially movably via insulating pipes 13. The movement of the holding plate is limited by the spring path, and also the frictional-lockup element—here tightening strap 14 and transverse groove 20—only permit a limited movement in the axial direction. The spring path and axial movability of insulator 2 are to be matched to one another and maintained at approximately the same length. Installation is simple and allows an arbitrary prestress force for fixing the module.

The course of tightening strap 14 can be taken from FIG. 2.

Instead of an arrangement having three insulating pipes, that is, with three securing options for the module, this arrangement can, of course, also be equipped with only two insulating pipes, or with more than three insulating pipes for fixation.

The above-described drawbacks can be eliminated in a simple manner by means of the invention.

We claim:

1. A preassembled structure, comprising:
   a stacked module including a disc cell semiconductor;
   a plurality of insulating pipes each being provided at one end with a flange;
   a plurality of spring elements positioned upon the respective flanges;
   a common holding plate at a first end of said stacked module for receiving said insulating pipes and being axially and movably guided by said insulating pipes, said holding plate having a lower side supported by the spring elements positioned on the flanges of said insulating pipes;
   a common insulator at a second end of said stacked module, said insulating pipes being guided through said common insulator so that said common insulator is axially and movably guided by said insulating pipes; and
   frictional lockup means comprising a tightening strap collectively surrounding said insulating pipes at said common insulator for causing a frictional lockup connection between said stacked module and said insulating pipes to axially secure said stacked module, said means cooperating with said spring elements for permitting a limited axial movement of said insulating pipes relative to said common holding plate and said common insulator.

2. The preassembled structure defined in claim 1, wherein said frictional lockup means comprises a plurality of transverse grooves each formed in a respective insulating pipe, said tightening strap encircling said insulating pipes and being received within the transverse grooves to have an axially restrained range of movement.

3. The preassembled structure defined in claim 1, wherein said frictional lockup means comprises a plurality of transverse grooves each formed in a respective insulating pipe, and said common insulator includes a plurality of laterally extending through holes for receiving said tightening strap and guiding said tightening strap to a respective transverse groove, said tightening strap encircling an outer region of said common insulator between adjacent through holes.

4. The preassembled structure defined in claim 1, wherein said tightening strap forms an external wrap around said insulating pipes, and said insulating pipes each include a transverse groove in a region of the external wrap.

5. The preassembled structure defined in claim 1, wherein said insulating pipes each include a transverse, circumferential, annular groove.

6. The preassembled structure defined in claim 1, wherein said common insulator includes a plurality of lateral through holes, said insulating pipes each include a first transverse groove for receiving said tightening strap and a second, opposite transverse groove, and said frictional lockup means includes a divided inside ring associated with said tightening strap for assisting said tightening strap to cause the frictional lockup connection, said divided inside ring being located and guided through said lateral through holes and said second, opposite transverse groove.

7. The preassembled structure defined in claim 1, wherein said spring elements comprise helical springs.

8. The preassembled structure defined in claim 1, wherein said spring elements comprise disk springs.

9. The preassembled structure defined in claim 1, wherein said spring elements are composed of a material having rubber elasticity.

10. The preassembled structure defined in claim 1, further comprising at least one terminal tag connected to said disc cell semiconductor, and projecting out away from said stacked module.

11. The preassembled structure defined in claim 1, wherein said stacked module further comprises an additional disc cell semiconductor located between said common holding plate and said common insulator.

12. The preassembled structure defined in claim 2, wherein said transverse groove is a circumferential, annular groove.

13. A preassembled structure, comprising:
    a module comprising a plurality of stacked components, said stacked components comprising:
       a common insulator at a first end of said module;
       a common holding plate at a second end of said module; and
       a disc cell semiconductor located between said common insulator and said common holding plate;
    a plurality of insulating pipes collectively arranged about, and essentially parallel to, a central, longitudinal axis of said module, said insulating pipes each having a first end guided through said common insulator so that said common insulator is axially and movably guided by said insulating pipes, said insulating pipes each having a second end projecting through said common holding plate so that said common holding plate is axially and movably guided by said insulating pipes, each second end of said insulating pipes being provided with a flange;
    a plurality of spring elements, each being coaxially positioned on a respective insulating pipe and between a respective flange and an outer side of said common holding plate, said common holding plate being supported by said spring elements; and
    frictional lockup means comprising a tightening strap in engagement with all of said insulating pipes at said common insulator for causing a frictional lockup connection between said stacked module and said insulating pipes to axially secure said stacked module, said means cooperating with said spring elements for permitting a limited axial movement of said insulating pipes relative to said common holding plate and said common insulator.

\* \* \* \* \*